United States Patent
Trotti et al.

(10) Patent No.: US 12,406,724 B2
(45) Date of Patent: Sep. 2, 2025

(54) RESISTIVE MEMORY WITH SELECTOR, EQUIPPED WITH A WRITE CAPACITOR, AND ASSOCIATED WRITING METHOD

(71) Applicants: COMMISSARIAT À L'ÉNERGIE ATOMIQUE ET AUX ÉNERGIES ALTERNATIVES, Paris (FR); WEEBIT NANO LTD, Hodhasharon (IL)

(72) Inventors: Paola Trotti, Grenoble (FR); Gabriel Molas, Grenoble (FR); Gaël Pillonnet, Grenoble (FR); Anthonin Verdy, Grenoble (FR); Amir Regev, Modiin (IL)

(73) Assignees: COMMISSARIAT À L'ENERGIE ATOMIQUE ET AUX ÉNERGIES ALTERNATIVES, Paris (FR); WEEBIT NANO LTD, Hod Hasharon (IL)

( * ) Notice: Subject to any disclaimer, the term of this patent is extended or adjusted under 35 U.S.C. 154(b) by 103 days.

(21) Appl. No.: 18/079,325

(22) Filed: Dec. 12, 2022

(65) Prior Publication Data
US 2023/0186987 A1 Jun. 15, 2023

(30) Foreign Application Priority Data
Dec. 14, 2021 (FR) ...................................... 2113463

(51) Int. Cl.
G11C 13/00 (2006.01)
(52) U.S. Cl.
CPC ...... *G11C 13/0069* (2013.01); *G11C 13/0038* (2013.01)

(58) Field of Classification Search
CPC . G11C 13/00; G11C 13/0002; G11C 13/0004; G11C 13/0007; G11C 13/0009; G11C 13/0011; G11C 13/0014; G11C 13/0021; G11C 13/0028; G11C 13/003; G11C 13/0038; G11C 13/0069; G11C 2013/0071; G11C 2013/0073; G11C 2013/0076; G11C 2013/0078; G11C 2013/008; G11C 2013/0083; G11C 2013/0085; G11C 2013/0088; G11C 2013/009; G11C 2013/0092; G11C 2013/0095
See application file for complete search history.

(56) References Cited

U.S. PATENT DOCUMENTS

2011/0026299 A1* 2/2011 Kanno ............... G11C 13/0097 365/189.011

* cited by examiner

*Primary Examiner* — Alfredo Bermudez Lozada
(74) *Attorney, Agent, or Firm* — Pillsbury Winthrop Shaw Pittman LLP

(57) ABSTRACT

A memory includes at least one resistive memory cell and a write device. The memory cell includes a memory element having at least a highly resistive state and a lowly resistive state, and a selector arranged in series with the memory element, the selector being electrically conductive when a voltage greater than a given threshold voltage is applied to the selector. The write device includes at least one write capacitor and one charging device, and is configured to charge the write capacitor and then to connect it to the memory cell to program that cell.

11 Claims, 6 Drawing Sheets

[Fig. 1]
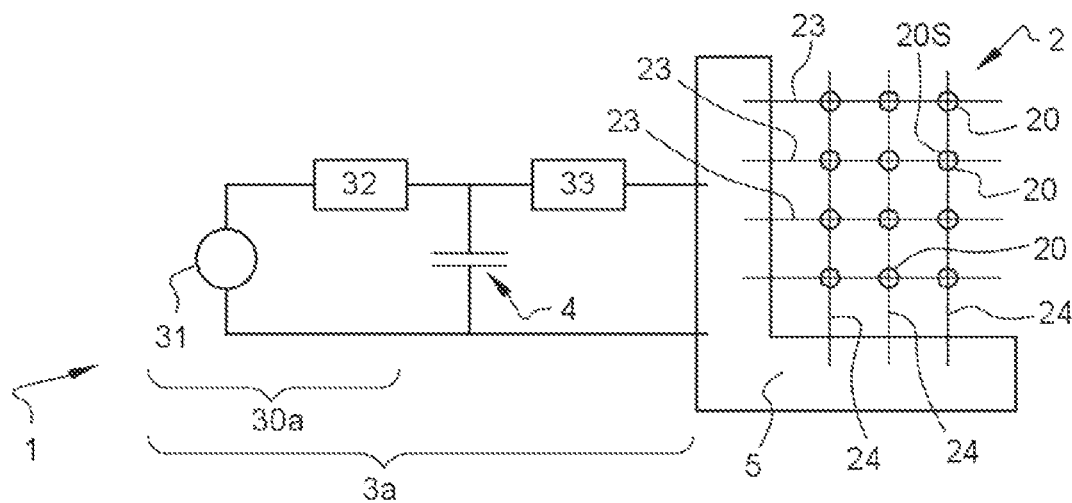
[Fig. 2]
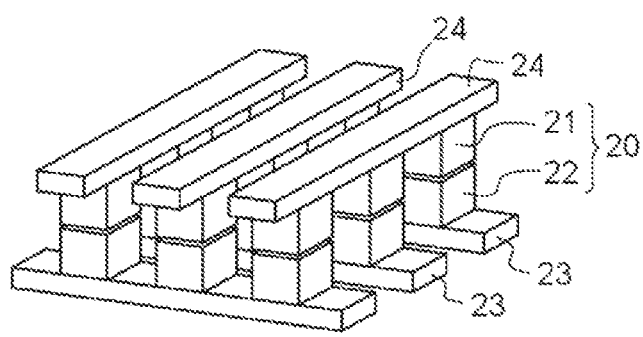

[Fig. 3]
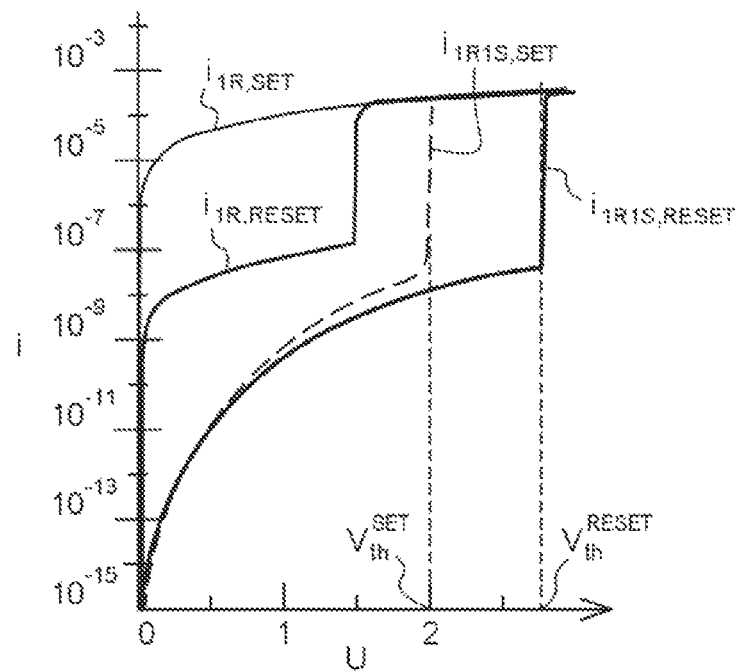
[Fig. 4]
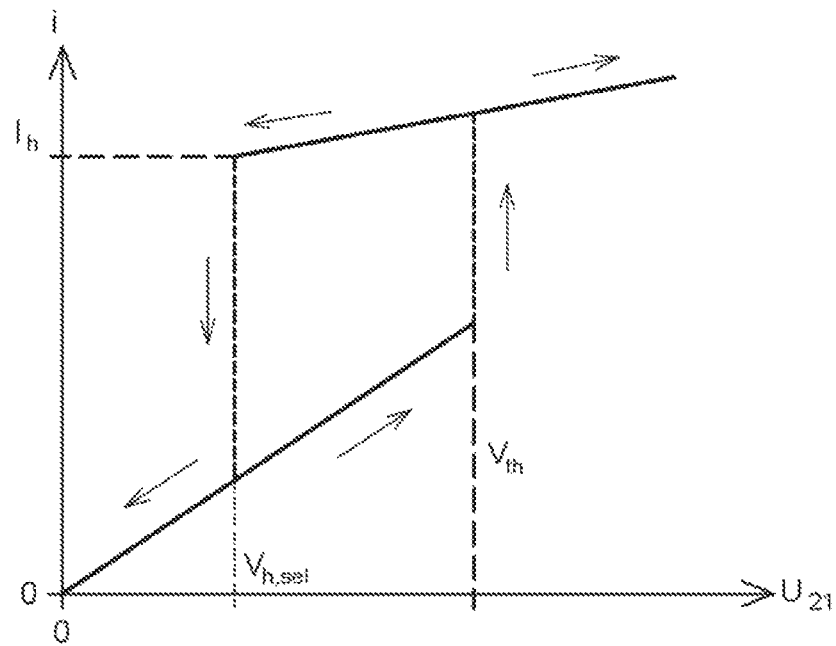

[Fig. 5]
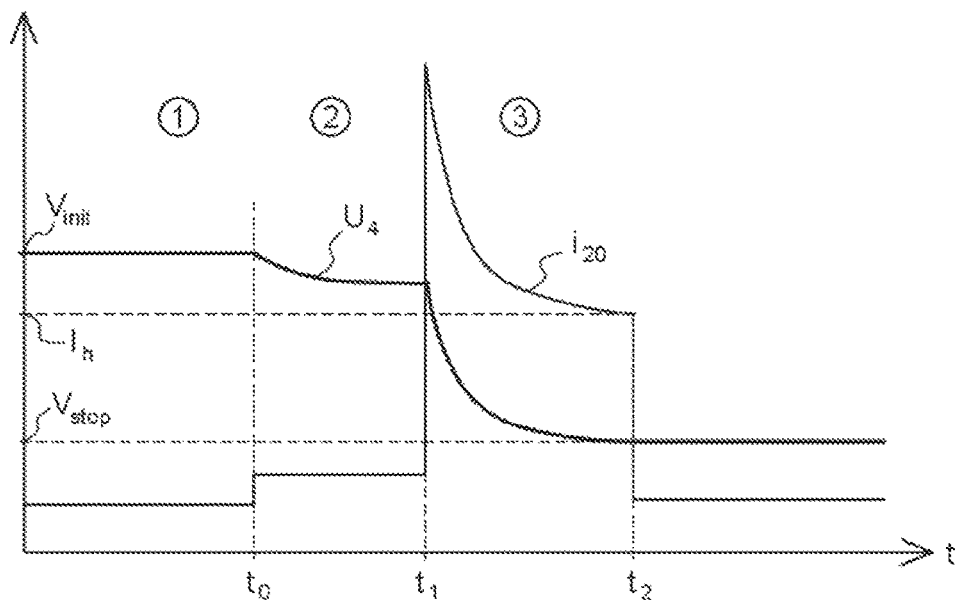
[Fig. 6]
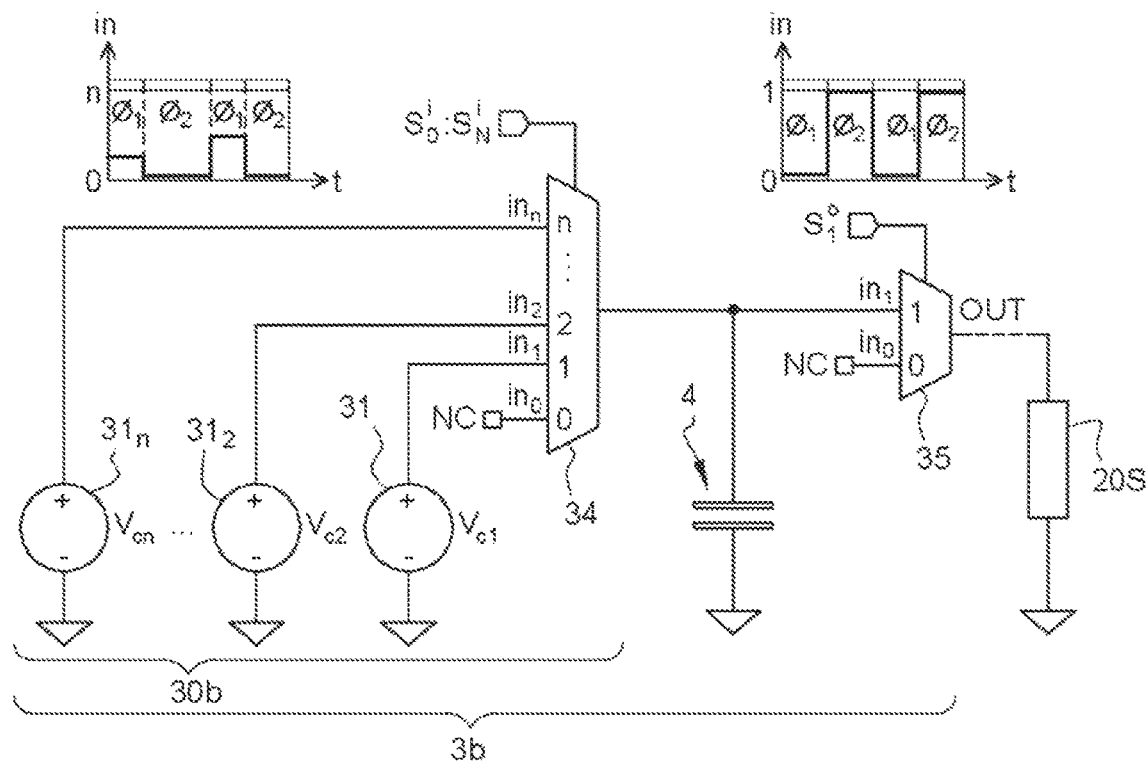

[Fig. 7]
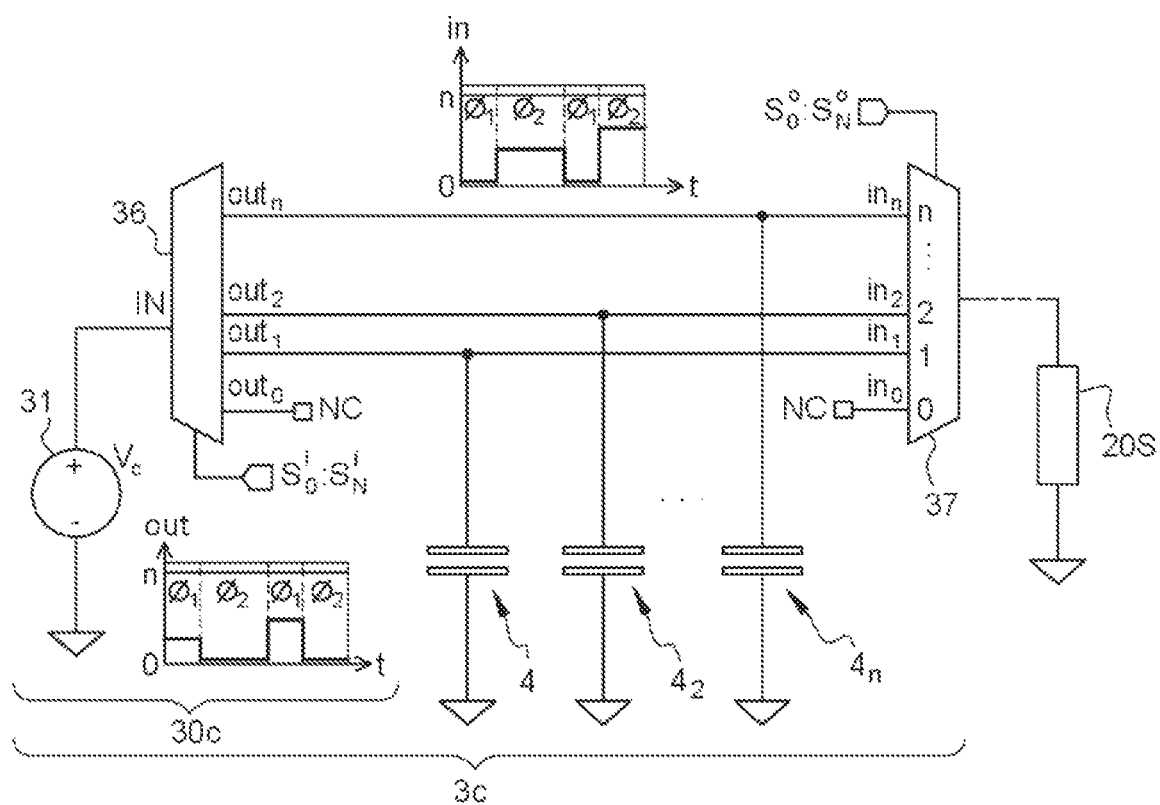

[Fig. 8]
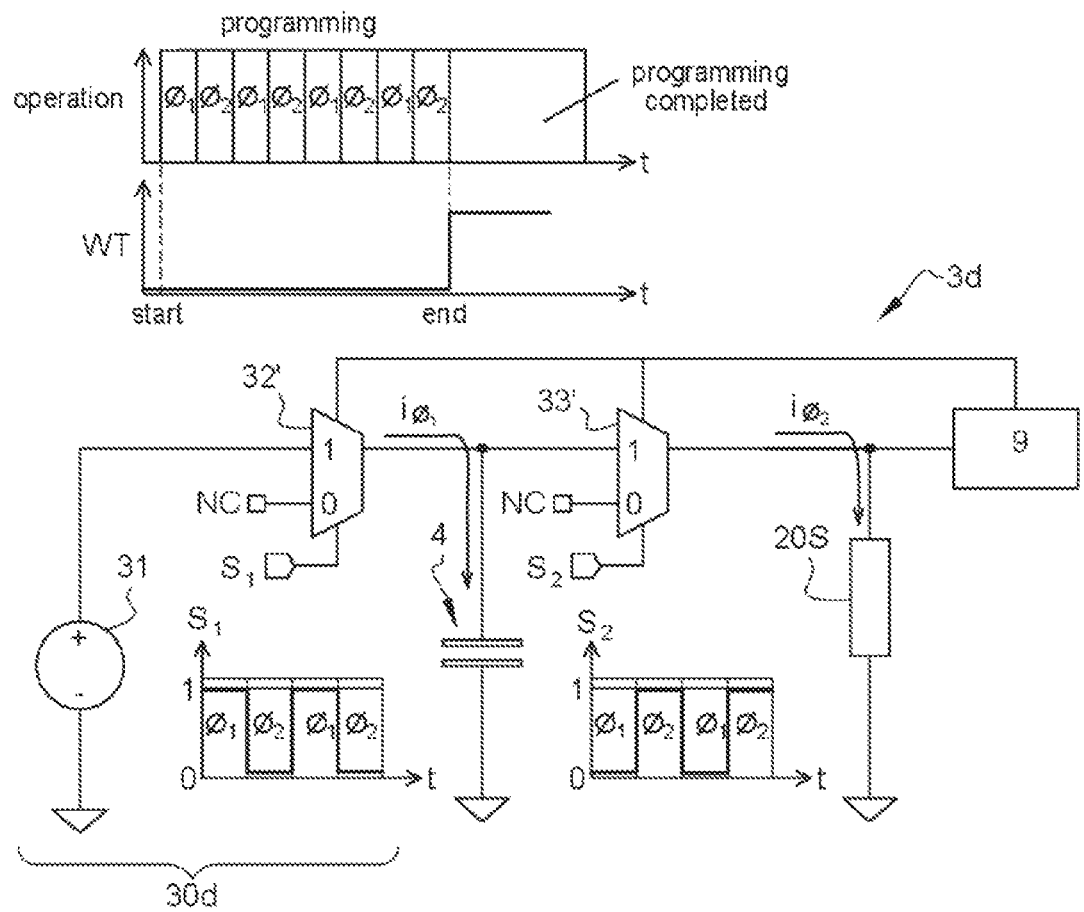
[Fig. 9]
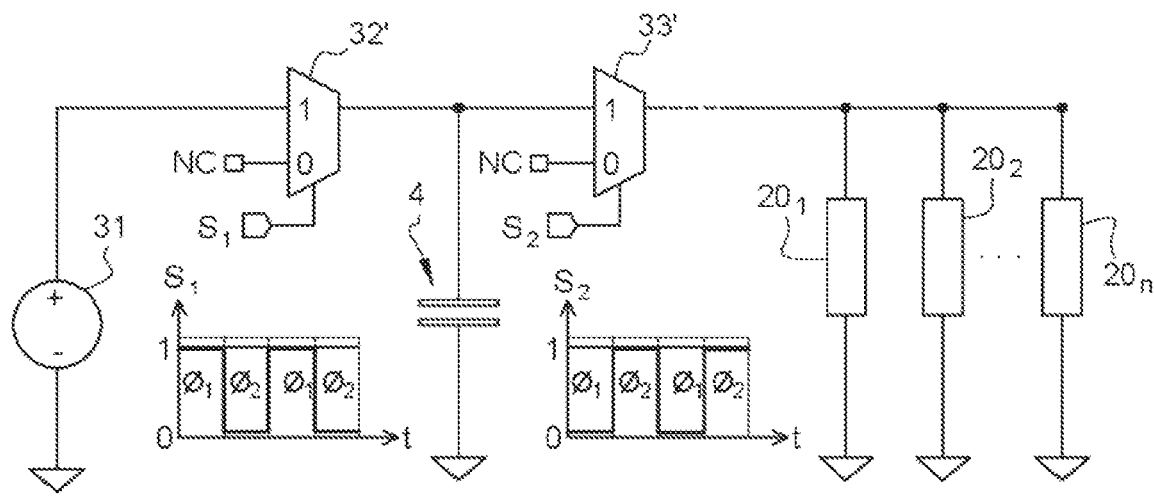

[Fig. 10]
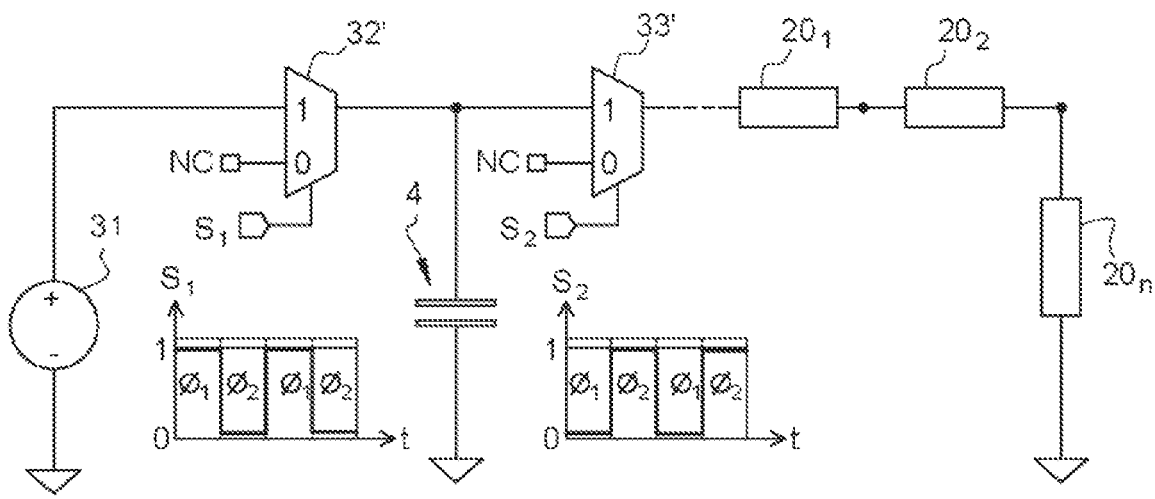

RESISTIVE MEMORY WITH SELECTOR, EQUIPPED WITH A WRITE CAPACITOR, AND ASSOCIATED WRITING METHOD

CROSS-REFERENCE TO RELATED APPLICATIONS

This application claims priority to French Patent Application No. 2113463, filed Dec. 14, 2021, the entire content of which is incorporated herein by reference in its entirety.

TECHNICAL FIELD

The technical field is that of microelectronics, more particularly that of resistive memories.

The invention especially relates to a particular write device, for writing one or more data in such a resistive memory.

TECHNOLOGICAL BACKGROUND

New types of non-volatile memories, called resistive memories, or sometimes ReRAM ("Resistive Random Access Memory"), have been developed in recent years. A memory of this type generally comprises an array of memory cells, sometimes called "memory points", each storing one piece of data, for example binary data. The binary data in question is represented by the resistance level, either high or low, of the memory cell considered. The data stored in such a memory cell can also be data that can take more than two different values (for example four different values, the data then comprising two bits), in the case of a "multi-level" memory cell. In this case, the memory cell has a resistance equal to one of its resistance levels (the number of which is greater than two), level which is associated with the value stored in the cell.

Different technologies are contemplatable, to make memory cells. For example, filament-type memory cells can be used, comprising an active layer in which an electrically conductive filament is either broken or, on the contrary, reformed in order to vary the resistance level of the memory cell, during write and reset cycles of this cell (SET operations, when the filament is reformed, and RESET, when the filament is broken again). Such a filament memory cell may, for example, be an OxRam type cell ("Oxide Random Access Memory") or a CB-RAM type cell ("Conductive Bridge Random Access Memory"). The resistive memory cells in question can also be PCRAM ("Phase Change Random Access Memory") cells, in which an amorphous-crystalline phase change is accompanied by a change in cell resistance.

In any case, in order to write data to be stored in one of the cells of the array, an electric voltage can apply or a given electric current can be imposed to this cell, for a duration, to make it transition from its highly resistive state to its low resistive state, or vice versa.

But during such a write operation, it is sometimes necessary to wait an amount of time between the time instant when the write voltage starts to be applied, and the moment when the memory cell changes its resistive state. But the corresponding waiting time is partly unpredictable, and may vary from cell to cell and from write to write: in some cases, the switchover may take place almost instantaneously, after only one or a few nanoseconds, while in other cases, the switchover may not occur until about 30 or 40 nanoseconds after the application of the write voltage. This phenomenon is sometimes referred to as "incubation".

To be able to write the considered memory cell suitably, the write voltage has to be applied as a square wave pulse of relatively long duration (longer than the maximum expected incubation time). In the case of a SET, that is, in a case where the memory cell is brought into its low resistive state, the time instant from which the cell becomes quite strongly conductive can be located either at the beginning of this pulse or rather at the end of it. When the memory cell switches to its low resistive state at the beginning of the write pulse, a significant electric current flows through the memory cell for a significant duration (i.e. for almost the entire duration of the write pulse). This results in significant consumption of electricity, and may also cause some form of degradation or small-scale mechanical stress (a "stress") within the memory cell.

To avoid this over-consumption, and this possible degradation, one solution consists of an active write detection and termination circuit (sometimes called "write termination"), which detects the transition from a highly resistive state to a low resistive state, for the cell to be written, and which stops the write pulse as soon as this transition has been detected. But this solution leads to a relatively complex device.

There is therefore a need for a simple, reliable and, if possible, space-saving solution that avoids electrical over-consumption (and possible degradation of memory cells) during write operations.

SUMMARY

Within this context, a memory is provided comprising at least one resistive memory cell, and a write device to program said cell,
the memory cell comprising:
  a memory element having at least a highly resistive state and a lowly resistive state, and
  a selector arranged in series with the memory element, the selector being electrically conductive when a voltage greater than a given threshold voltage is applied to the selector and provided that a current flowing through the selector is greater than a given holding current,
the write device comprising at least one write capacitor and one charging device, and being configured to:
  a) charge the write capacitor with the charging device to a given initial write voltage, the write capacitor being disconnected from said memory cell during charging of the capacitor, and then to
  b) connect the write capacitor thus charged, to said memory cell, to program said cell.

Since the voltage applied to the memory cell to write it (i.e. to program it) is applied by connecting it to the capacitor, the energy consumed during writing is intrinsically limited (by the energy initially stored in the capacitor, during the charging step a)). The passage of the electric current in the memory cell, during the write operation, naturally (and in a way, automatically) leads to a decrease in the voltage applied to the memory cell, due to the discharge of the write capacitor in the memory cell, thus avoiding electrical over-consumption, and this even if the time instant of switchover from the highly resistive state to the lowly resistive state (or vice versa) is partly unpredictable.

The use of such a bipolar threshold switch (in practice of the "back-end" type, sometimes also called co-integratable), in series with the memory element, allows for a convenient manufacture of the memory, as well as a better compactness than by employing a selection transistor, instead of the selector in question. A back-end selector ("Back-End-Of-Line", or BEOL) is typically made in levels greater than 1 above a substrate (for example, a silicon substrate), in contrast to front-end-of-line (FEOL) components which are manufactured on the surface of the substrate (diodes and CMOS transistors, for example), especially in level 1. Such a selector can be formed by layers deposited on or under a memory layer, and etched as a whole at the same time as the memory layer (which allows self-alignment of the selector and the memory element), hence the name co-integratable (since they are integrated in the same level, in terms of manufacturing technology).

Moreover, in this memory, the limitation of the energy consumed comes both from the use of the write capacitor (as explained above), but also from the use of this selector, which, in a particularly simple form, and in combination with this capacitor, acts as a sort of write detection and termination circuit, due to the turning off of the selector when the current flowing therethrough becomes lower than the holding current of the selector which has been mentioned above. This type of selector with double threshold is for example an OTS type selector.

It should be noted that the OTS type selector has two terminals and, consequently, is controlled differently from the OTS type selector described in document US2009/0116280A1, which, in turn, has three terminals. The write problems are therefore different.

It will be noted that it is not at all immediate that such an arrangement, with a memory cell with a threshold selector, and with a write capacitor, can function suitably. Indeed, the presence of two operating thresholds for the selector (one for opening, and the other for closing/holding), and the requirements related to writing, could lead to fears: either that the capacitor in the memory element will not be discharged sufficiently (the selector will turn off again too quickly), or that undesirable oscillatory phenomena will occur (indeed, due to the presence of stray capacitances in 1S1R crossbar arrays, it is known that threshold selectors can turn off (if the conditions for maintaining the conductive state—that is, the on state—are not satisfied; in particular if the current flowing through the 1S1R cell becomes lower than the holding current), then, under the effect of recharging of the stray capacitances, turn on (if the voltage across the 1S1R cell becomes greater than its threshold voltage $V_{th,1S1R}$), in order to turn off again, and thus to cause particularly undesirable oscillations). Moreover, it might be feared at first sight that the adapted capacitance values are large, thus making the write capacitor cumbersome. Finally, it might be feared that interfacing a capacitor to an entire array of crossbar memory cells would add difficulties, related for example to the presence of leakage, stray bulk capacitance, addressing or simultaneous threshold triggering.

But, as explained in the description, a more detailed study shows that the use of such a threshold selector and a write capacitor are in fact compatible (a discharge, through the selector, until writing the memory element, is possible in practice), and even, together, produce an interesting automatic discharge limiting effect.

Moreover, the capacitance values to be employed are small enough not to increase the size of a crossbar type memory array.

Another aspect of the invention is a memory comprising an array of resistive memory cells of the same type including at least one memory cell to be programmed, a write device to program the at least one memory cell to be programmed and a connection device configured to selectively connect the at least one memory cell to be programmed to the write device, or to connect a given group of memory cells of the array to the write device, the array comprising row electrical tracks and column electrical tracks, each memory cell being connected between, on the one hand, one of the row electrical tracks and, on the other hand, one of the column electrical tracks, this memory cell comprising:
  a memory element having at least a highly resistive state and a lowly resistive state, and
  a selector arranged in series with the memory element, the selector being electrically conductive when a voltage greater than a given threshold voltage is applied to the selector, and provided that a current flowing through the selector is greater than a given holding current,
the write device comprising at least one write capacitor and one charging device, and being configured to:
  a) charge the write capacitor with the charging device to a given initial write voltage, and then
  b) connect the write capacitor thus charged, to the at least one memory cell to be programmed by the connection device, to program said cell.

In addition to the above-mentioned characteristics, the memory just set forth comprising at least one memory cell or an array of memory cells may have one or more of the following optional characteristics, considered individually or in any technically contemplatable combination:
  the write capacitor has an electric capacitance greater than or equal to an electric capacitance $C_{o,1}$ defined by the following formula (F1):

$$E_{SET} = \tfrac{1}{2}(V_{init}^2 - V_{stop}^2)C_{o,1} \tag{F1}$$

where:
  $V_{init}$ is the initial write voltage,
  $V_{stop}$ is an end-of-write voltage, equal to, or greater than, an on state holding voltage of the memory cell, and where
  $E_{SET}$ is an electric energy to be supplied to the memory cell to make it transition from its highly resistive state to its lowly resistive state;
  the electric capacitance of the write capacitor is furthermore greater than or equal to an electric capacitance $C_{o,2}$ defined by the following formula (F2):

$$E_{SET} = \frac{1}{2}\left(\left[\frac{C_{o,2}}{C_{o,2}+C_{par}}V_{init}\right]^2 - V_{stop}^2\right)\cdot(C_{o,2}+C_{par}) \tag{F2}$$

where $C_{par}$ is a stray electric capacitance, exhibited by the memory between the write capacitor and the cell programmed in step b);
  the capacitance of the write capacitor is between one and three times $C_{o,2}$;
  the electric capacitance of the write capacitor is, furthermore, greater than or equal to an electric capacitance $C_{o,3}$ defined by the following formula (F3):

$$E_{SET} = \frac{1}{2}\left(\left[\frac{C_{o,3}}{C_{o,3}+C_{par}}V_{init}\right]^2 - V_{stop}^2\right)\cdot(C_{o,3}+C_{par})\cdot\alpha \tag{F3}$$

with $\alpha =$ $$\frac{R_{RESET}}{R_{RESET}+R_{sel}}\cdot\frac{R_{leak}}{R_{leak}+R_{RESET}+R_{sel}}\cdot\left(1-\frac{R_{par}}{R_{par}+(R_{RESET}+R_{sel})//R_{leak}}\right)$$

where:
$R_{par}$ is a series stray resistance, exhibited by the memory between the write capacitor and the cell programmed in step b),
$R_{RESET}$ is an electrical resistance of the memory element in its highly resistive state,
$R_{leak}$ is a leakage resistance of the array,
$R_{sel}$ is an electrical resistance of the selector in the on state, and where
$(R_{RESET}+R_{sel})/R_{leak}$ is the resistance equal to: the resistance $R_{leak}$ connected in parallel to the resistance $R_{RESET}+R_{sel}$;

the charging device comprises:
  different voltage sources, and
  a multiplexer having: different inputs connected respectively to these different voltage sources, and an output connected to the write capacitor, to selectively connect either of said sources to the write capacitor;
the write device comprises:
  an electric source,
  at least one additional write capacitor,
  a charge multiplexer having: an input electrically connected to the electric source, and at least two outputs, respectively connected to the write capacitor and to the additional write capacitor, to selectively connect the electric source to either of these write capacitors,
  a write multiplexer having: at least two inputs, connected respectively to the write capacitor and to the additional write capacitor, and an output electrically connected to the memory cell, to selectively connect the memory cell to be programmed to either of the write capacitors;
the write device comprises a control module configured to drive the charge multiplexer and the write multiplexer so that:
  during a first phase: the write capacitor is disconnected from the source and connected to the output of the write multiplexer, while the additional write capacitor is connected to the source and disconnected from the output of the write multiplexer, and so that
  during a second, subsequent phase: the additional write capacitor is disconnected from the source and connected to the output of the write multiplexer, while the write capacitor is disconnected from the output of the write multiplexer;
the write device is configured to perform steps a) and b) several times successively so as to apply a sequence of several successive write pulses to said memory cell, and the write device comprises a write detection and termination circuit, configured to:
  detect a transition of the memory cell, from its highly resistive state to its lowly resistive state, or vice versa, and then to
  control a termination of said sequence of write pulses as soon as the transition of the memory element, from its highly resistive state to its low resistive state, or vice versa, has been detected;
the connection device is configured to, in step b), connect the write capacitor to several memory cells of the array, electrically connected in parallel with each other;
the connection device is configured to, in step b), connect the write capacitor to several memory cells of the array electrically connected in series with each other, or to electrically connect the write capacitor to said memory cell, as well as to a memory cell of another array of memory cells, these two memory cells being electrically connected in series one after the other.

Another aspect of the invention relates to a method for writing a resistive memory cell, by means of a write device comprising at least one write capacitor and one charging device, the memory cell comprising:
  a memory element having at least a highly resistive state and a lowly resistive state, and
  a selector arranged in series with the memory element, the selector being electrically conductive when a voltage greater than a given threshold voltage is applied to the selector and provided that a current flowing through the selector is greater than a given holding current,
the method comprising the following steps of:
  a) charging the write capacitor with the charging device to a given initial write voltage, the write capacitor being disconnected from said memory cell during charging of the capacitor, and then
  b) connecting the write capacitor thus charged, to the memory cell to program said cell.

The optional characteristics, set forth above in terms of device, can also be applied to the writing method just described. In particular, the write capacitor employed in steps a) and b) may have an electric capacitance greater than or equal to the electric capacitance $C_{o,1}$ defined by the formula (F1) above.

The present technology and its various applications will be better understood upon reading the following description and examining the accompanying figures.

BRIEF DESCRIPTION OF THE FIGURES

The figures are set forth for indicative and in no way limiting purposes of the invention.

FIG. 1 schematically represents a resistive memory.

FIG. 2 schematically represents, in perspective, a portion of an array of memory cells of the memory of FIG. 1.

FIG. 3 schematically represents a current-voltage characteristic of an example of a memory cell that may equip the memory of FIG. 1.

FIG. 4 schematically represents a current-voltage characteristic of an example of a selector that may equip this memory cell.

FIG. 5 shows especially the time change of the voltage across a write capacitor of the memory, during a write operation of a lowly resistive state in a memory cell of the memory.

FIG. 6 is a simplified electrical diagram of a write device that may equip the memory of FIG. 1, instead of the write device represented in FIG. 1.

FIG. 7 is a simplified electrical diagram of another write device which may also equip the memory of FIG. 1, instead of the write device represented in FIG. 1.

FIG. 8 is a simplified electrical diagram of yet another write device which may also equip the memory of FIG. 1, instead of the write device represented in FIG. 1.

FIG. 9 schematically represents a connection mode between the write device of FIG. 1 and several memory cells, connected in parallel with each other.

FIG. 10 schematically represents another connection mode between the write device of FIG. 1 and several memory cells, connected in series with each other.

DETAILED DESCRIPTION

As mentioned above, the present technology especially relates to a memory, comprising at least one, here several resistive memory cells, and comprising a capacitor write device to program these memory cells, that is, to write data into these cells.

An example of such a memory, 1, is represented in FIG. 1. This memory 1 comprises:
- an array 2 of memory cells, 20,
- the write device 3a, which comprises a write capacitor 4 and a charging device 30a to charge this capacitor, and
- a connection device 5, configured to selectively connect the write capacitor 4 with one of the memory cells 20 of the array 2, or with a given group of memory cells 20 of the array.

FIGS. 6, 7 and 8 schematically represent three alternatives 3b, 3c and 3d of the write device 3a of FIG. 1. Each of these alternatives may equip the memory 1 of FIG. 1, instead of the write device 3a.

The memory 1 will first be described in general terms, as well as the operating principle of its write device. The sizing of the write capacitor(s) will then be set forth in more detail. Finally, the alternatives of the write device 3b, 3c and 3d, as well as particular connection modes of the memory cells to be programmed will be described, with reference to FIGS. 6 to 10.

The array 2 comprises n row electrical tracks 23, and m column electrical tracks 24, for example metal ones. The memory cells 20, the number of which is m×n, are located at the intersections between the row electrical tracks and the column electrical tracks. For example, m and n may be equal to 128. The memory cells 20 of the array are of the same type (they are manufactured together, in the same way, and therefore have the same or very similar characteristics).

Each memory cell 20 is connected between, on the one hand, one of the row electrical tracks and, on the other hand, one of the column electrical tracks. Thus, in order to apply an electric voltage V (for example a write voltage) to one of the memory cells, located at the intersection between one of the row electrical tracks and one of the column electrical tracks, this electric voltage is applied between this row electric track and this column electrical track.

The array 2, and more generally the memory 1, can be made by planar techniques, in the form of a stack of several etched and functionalised layers. As schematically represented in FIG. 2, the row electrical tracks 23 may then be located in a lower layer while the column electrical tracks 24 are located in an upper layer (or vice versa), with the memory cells 20 (also called memory points) then extending between this lower layer and this upper layer. This type of array is often referred to as a "crossbar" array, in this technical field.

Each memory cell 20 comprises a memory element 22 whose resistance can be electrically adjusted:
- either to a low resistance level, during a write operation generally called "SET",
- or to a high resistance level, during another write operation generally referred to as "RESET" (sometimes considered as a reset operation).

In its lowly resistive state, the resistive element 22 has a, low, electrical resistance, denoted as $R_{SET}$, and in its highly resistive state it has a, high, electrical resistance, denoted as $R_{RESET}$.

A piece of data may be written to and stored in each memory cell 20, this piece of data being represented by the resistance level of the memory element 22. Here, the data in question are binary data, and the memory cells are programmed so as to place their respective memory elements 22 either in their highly resistive state or in their lowly resistive state.

However, alternatively, more than two distinct resistance levels could be exploited for each memory element ("multilevel" elements), so as to store in each cell a piece of data that can take more than two different values. The present technology, based especially on a write capacitor, is set forth below in the case of two-level memory elements, but it can also be applied to multi-level memory cells as mentioned above.

Here, the memory element 22 is of the OxRAM type. Alternatively, it could also be a CB-RAM, PCRAM, MRAM (Magnetic RAM), where relative magnetisation between a reference magnetic layer and a programmable magnetic layer is implemented, or, more generally, a ReRAM type memory element.

Each memory cell 20 comprises, in addition to the memory element 22, a selector 21 arranged in series with the memory element 22 (FIG. 2). From an electrical point of view, the selector 21 and the memory element are connected in series, one after the other, between the two corresponding tracks 23, 24. The memory cells are of the "1S1R" type, here.

These selectors 21 are switching elements. They make it possible to reduce the leakage currents flowing through the cells that are not being read or written at the time instant considered. These are threshold selectors 21.

Each selector 21 becomes electrically conductive, that is, switches to the on state, when the voltage across it becomes greater than a threshold voltage $V_{th}$. Moreover, the selectors 21 are of the holding threshold type: each selector switches back to the off state if the current flowing therethrough becomes lower than a holding current $I_h$.

The selectors 21 are so-called "back-end" selectors. They are made by depositing layers, which can be deposited at almost the same stages of manufacture as the layer(s) of the memory elements 22. Moreover, the layer(s) of such a selector can be etched at the same time as those of the corresponding memory element, together (during a same etching operation), which facilitates the making of the memory and allows the dimensions of the memory cell 20 to be reduced to a minimum.

Different technologies can be contemplated for making these "backend" selectors 21. For example, they may be MIT (metal-insulator transition switch) type selectors.

The selectors 21 can also, as here, be OTS type selectors (for "Ovonic Threshold Switch"). OTS switches are threshold switches made from chalcogenide alloy films, such an alloy being comprised of a non-oxygen chalcogen element (S, Se, Te), alloyed with elements such as Ge, Si, Sb, As, Al, Zn, Ga. They can be doped with light elements such as B, C, N, O, P (with dopant concentrations that can be greater than 1 atomic %).

FIG. 3 shows current-voltage characteristics for one of the memory elements 22 alone, and for the corresponding full memory cell 20 (memory element 22+selector 21).

In this figure, the electric current i flowing through the element considered (expressed in arbitrary units) is represented as a function of the voltage U applied across it (also in arbitrary units). The measurement points $i_{1R,SET}$ and $i_{1R,RESET}$ correspond to the memory element 22 alone, in its lowly resistive state and in its highly resistive state respectively. The measurement points $i_{1R1S,SET}$ and $i_{1R1S,RESET}$ correspond in turn to the whole memory cell, when the memory element 22 is in its lowly resistive state and in its highly resistive state, respectively.

As can be seen in this figure, when the memory element 22 is in its low resistive state (SET) and the selector 21 has not yet switched to its conductive state, if the voltage U applied to the memory cell is gradually increased, when it exceeds a memory cell threshold voltage $V_{th}^{SET}$, the selector switches to the on state, and the current flowing through the memory cell suddenly increases. Prior to this switchover, the resistance of the memory element 22 (in its lowly resistive state), $R_{SET}$ (for example, in the order of a few kilohms or possibly in the order of ten or a few tens of kilohms, depending on the technology employed), is significantly smaller than that of the selector (the resistance of the selector, just below the selector threshold voltage $V_{th}$, is typically in the order of megohms). Most of the voltage U applied to the memory cell 20 is therefore across the selector 21 (the voltage U is mainly distributed across the selector). The memory cell threshold voltage $V_{th}^{SET}$ is therefore very close to the selector threshold voltage $V_{th}$. The overall resistance of the memory cell 20 after the selector has switched to the on state can be expressed as $R_{SET}+R_{sel}$ where $R_{sel}$ is a resistance (effective resistance) of the selector 21 in the on state (for example in the order of kilohms).

In contrast, when the memory cell 22 is in its highly resistive state (RESET), its resistance $R_{RESET}$ is closer to the resistance of the selector 21 just prior switchover. The voltage U applied to the memory cell is then distributed between the selector and the memory element, so that a voltage U just above $V_{th}$ is no longer sufficient to switch the selector to its on state (i.e. to its conductive state). In practice, as long as the voltage U is lower than a high voltage threshold $V_{th}^{RESET}$, then the selector remains off. Above this threshold, not only does the selector switch to its on state, but in addition, the memory element transitions to its lowly resistive state (while it was initially in its highly resistive state); in other words, a SET state is then written to the memory cell.

FIG. 4 schematically represents the current-voltage characteristic of any of the selectors 21. The voltage $U_{21}$ applied to the selector corresponds to the abscissa axis, while the ordinate axis corresponds to the current i flowing through the selector (in logarithmic scale). As can be seen in this figure, when the selector 21 is in the on state, if the current flowing therethrough becomes lower than a holding current $I_h$, then the selector switches back to the off state. The corresponding voltage across the selector, just before it turns off again, is called the selector holding voltage $V_{h,sel}$.

The voltage across the entire memory cell 20 (including the selector 21 and memory element 22), when the memory element 22 is in its lowly resistive state (SET), and just before the selector 21 turns off again, is in turn called the holding voltage $V_{h,1S1R}$. It can be expressed as the sum of the selector holding voltage $V_{h,sel}$ and the product $I_h \times R_{SET}$:
$V_{h,1S1R}=V_{h,sel}+I_h \times R_{SET}$.

Here, the memory 1 also comprises a connection device 5, configured to selectively connect, that is, to address one of the memory cells 20 of the array 2 (for example the cell marked with reference 20S, in FIG. 1), to the write device 3a (or, alternatively, 3b, 3c, or 3d) of the memory.

The connection device 5 thus makes it possible to select the cell to be programmed (in the example of FIG. 1, the selected cell is cell 20S), and to connect this cell (but not the others) to the write device.

The connection device 5 may also be configured to connect a given group of memory cells of the array (i.e. a given subset of memory cells of the array) to the write device.

The connection device may for example comprise several controllable switches (such as transistors), for example one for each row electrical track 23 (end of track), and one for each column electrical track 24 (end of track).

The connection device 5 may also be configured to bias the entire array 2 to a given electrical bias configuration when writing (or reading) the selected memory cell(s) 20S.

When such and such cell of the array 2 is written, the other cells of the array (or, at least, some of the other cells) are then also biased (so as not to leave them at a floating potential), but in such a way as to apply to them a voltage which remains lower than a write voltage, beyond which these cells would be rewritten. This bias voltage may in particular be lower than the threshold voltage $V_{th}$ of the selectors. For example, this bias configuration can be the configuration generally called "V/2" in this technical field. In this configuration, the row and column electrical tracks are biased so that:
   a voltage V is applied to the selected cell 20S,
   while a bias voltage V/2 is applied to the (m+n−2) cells, other than the targeted cell 20S, and belonging to the same row and the same column as this cell 20S,
   a zero voltage being applied to the other cells of the array 2.

As for the charging device 3a; 3b; 3c; 3d, whatever the alternative considered, it is configured to:
   a) charge the write capacitor 4 with the charging device 30a; 30b; 30c; 30d of the write device, to a given initial write voltage $V_{init}$ (i.e. until the voltage across the capacitor 4 is equal to this voltage $V_{init}$), the write capacitor being disconnected from the memory cell to be programmed during charging of the capacitor, and then to
   b) connect the write capacitor 4, thus charged, to the memory cell to be programmed, to program this cell.

The charging device 30a; 30b; 30c; 30d comprises:
   at least one electric source, for example a voltage source (31, in FIG. 1), to charge the write capacitor 4, and
   a first switching element (32, in FIG. 1), such as a transistor or a multiplexer, having at least:
      a closed state, in which it connects the source to the write capacitor 4 (in step a) for charging the write capacitor), and
      an open state, in which it disconnects the write capacitor 4 from the source.

The write device 3a; 3b; 3c; 3d may also comprise a second switching element (33, in FIG. 1), having at least:
   a closed state, in which it connects the write capacitor 4 and the memory cell to be programmed, here via the connection device 5, and
   an open state, in which it disconnects the write capacitor 4 from this memory cell.

In practice, this second switching element may either be part of the connection device 5 (i.e. be integrated directly into the switching device 5) or be separate from it.

The charging device 30a; 30b; 30c; 30d here comprises a control module (in practice, an electronic control circuit, for example a programmable integrated logic circuit), not represented, configured to control the first and second switching elements so as to:
   connect the source and the write capacitor 4 while keeping this capacitor disconnected from the cell to be programmed, 20S, during the charging step a), and then to
   connect the write capacitor 4 to the cell to be programmed 20S while keeping the capacitor disconnected from the source, during the writing step b).

The charging device 30a; 30b; 30c; 30d is thus configured to, during the write step b), disconnect the capacitor from the source.

In the example of FIG. 1, the charging device 30a of the write device 3a comprises the above-mentioned voltage source 31 (this voltage source delivers, for example, a voltage equal to the initial write voltage $V_{init}$), and the first switching element, 32.

A first output terminal of the source 31 is connected to a first terminal of the write capacitor 4, for example directly (that is, via an electrical conductor, without any intermediate component), while the second output terminal of the source is connected to the second terminal of the capacitor 4 via the first switching element 32.

The first switching element 32 is for example a transistor, but can also be a multiplexer, such as the multiplexer 32' of FIG. 8 or 9, having for example two inputs and one output. In this case, the output of the multiplexer is connected to one of the two terminals of the write capacitor, one of the inputs of the multiplexer is connected to the second terminal of the source, and the other input of the multiplexer (marked NC in the figures) is not connected.

The first terminal of the write capacitor 4 is moreover connected to the connection device 5 of the array 2, for example directly, while the second terminal of this capacitor is connected to this connection device via the second switching element 33. The second switching element may also be a transistor, for example, or a multiplexer, such as the multiplexer 33' of FIG. 8, also having an output (connected to the connection device 5) and at least two inputs, one connected to the second terminal of the capacitor 4, and the other not connected.

FIG. 5 schematically shows the change, over time t, of the voltage $U_4$ across a write capacitor 4, during a write operation of a lowly resistive state (SET) in the memory cell 20S of the memory 1. The time change of the electric current $i_{20}$ flowing through the memory cell is also represented.

As mentioned above, the write capacitor 4 is previously charged, at the initial write voltage $V_{init}$, in a first phase (phase "1", in FIG. 5). At the end of this first phase, at time instant $t_o$, the write capacitor 4 is connected to the selected cell 20S (by controlling the second switching element 32 and the connection device 5 for this purpose).

Then, the electric charge initially contained in the write capacitor 4 starts to be distributed between this capacitor and the stray capacitance $C_{par}$ (stray capacitance of the array 2, and of the electric circuit elements that connect it to the write capacitor), in a second phase (phase "2" in the figures). The voltage U across the memory cell 20S then gradually increases towards a "charge balance voltage" $V_{eq}$, where $V_{eq}=C/(C+C_{par})\cdot Vinit$, where C is the electric capacitance of the write capacitor. When the voltage U becomes greater than the high voltage threshold $V_{th}^{RESET}$ of the memory cell (in its highly resistive state), the selector switches to the on state (this time instant is marked by the time instant $t_1$ in FIG. 5), thus initiating a third phase, "3", of discharge of the write capacitor.

During this third phase, the capacitor 4 is partially discharged into the memory cell 20S, which allows sufficient energy to be supplied to the memory element 22 to make it transition from its highly resistive state to its lowly resistive state. During this third phase, the voltage $U_4$ across the write capacitor decreases, as well as the current $i_{20}$ flowing through the memory cell. When the current $i_{20}$ becomes lower than the holding current $I_h$ (at time instant $t_2$, in FIG. 5), the selector switches back to its off state, which marks the end of this third phase. The discharge of the write capacitor 4 then stops (and the current $i_{20}$ significantly drops). The voltage across the write capacitor 4, at the end of this third phase, is called the end-of-write voltage $V_{stop}$. It is equal to (or possibly slightly higher than) the sum of the holding voltage $V_{h,1S1R}$ of the memory cell 20, and an equivalent row stray resistance $R_{par}$ multiplied by the holding current $I_h$. The end-of-write voltage $V_{stop}$ can therefore also be expressed as $V_{h,sel}+R_{par}\times I_h+R_{SET}\times I_h$ where $V_{h,sel}$ is the holding voltage of the selector 21 alone (see FIG. 4), in a case where the (total) leakage current $I_{leak}$ flowing through the other, non-selected memory cells is negligible. If this is not the case, the end-of-write voltage $V_{stop}$ may be expressed, more precisely, as $V_{h,sel}+R_{par}\times(I_h+I_{leak})+R_{SET}\times I_h$.

As mentioned in the "summary" section, the fact that the selector turns off again when the current becomes lower than the holding current $I_h$ may seem problematic at first sight, since it limits the electric energy that can be transmitted to the memory element during this discharge (thus potentially preventing proper writing of the memory element). But in fact, by appropriately sizing the capacitor 4 and the voltage source 31, as explained below, sufficient energy can be transmitted to the memory element to successfully perform this writing, before the selector turns off again. The turning-off-again effect of the selector then makes it possible to limit the energy consumed for this write (and the possible undesirable heating effects of the memory element), by preventing a full discharge of the capacitor. In terms of power consumption reduction, this arrangement with a write capacitor and turning-off-again selector is therefore even more efficient than a solution based solely on a write capacitor (a solution which would already be much more efficient than writing directly from a voltage source, without a write capacitor limiting the total energy consumed).

Concerning sizing of the write capacitor 4, the value of its capacitance C is chosen especially as a function of the electric energy $E_{SET}$ to be supplied to the memory element 22 to make it transition from its highly resistive state to its lowly resistive state.

The inventors have indeed found that, as long as the selector is in its on state, a write operation of a SET state is generally performed successfully provided that the electric energy communicated to the memory cell is greater than or equal to a given energy level, which is precisely the energy $E_{SET}$ in question.

The energy $E_{SET}$ may therefore be the minimum energy, required on average to make the memory cell transition from its RESET state to its SET state (average over several memory cells of the same type, for example, or average over several successive write operations of a SET state, on the same memory cell).

It may also be the energy above which the proportion (in other words, the probability) of success of the RESET→SET write operation is greater than a given threshold, for example, greater than 90%, or greater than 95% (instead of just greater than 50%). In particular, $E_{SET}$ may be the energy above which the success of the RESET→SET write operation is considered almost certain (corresponding for example to a success threshold of 99% or more; in this case, the value of $E_{SET}$ may be obtained by extrapolation from a distribution of energy values consumed for several write operations).

The energy $E_{SET}$ is the limit energy, for which this proportion of success is reached, for a given write protocol (indeed, the proportion of success may depend on the write protocol employed, such a protocol being defined by: the use of a single pulse, or on the contrary of several successive pulses; and/or by the shape, the amplitude, and/or the duration of the pulse(s)). Preferably, the protocol, corresponding to the $E_{SET}$ value in question, is a protocol having characteristics corresponding to (for example identical to)

the characteristics of the write operation performed with the present capacitor write device 4.

The energy $E_{SET}$ may be determined from tests performed on a memory element or elements 22 of the type considered.

In a first, simplified approach, the capacitance C of the write capacitor 4 may be chosen to be greater than or equal to the capacitance $C_{o,1}$ defined by the following formula F1:

$$E_{SET} = \tfrac{1}{2}(V_{init}^2 - V_{stop}^2)C_{o,1} \tag{F1}$$

The capacitance C of the write capacitor 4 can also be chosen by taking account of the stray capacitance $C_{par}$ mentioned above (stray capacitance of the array 2, and of the electrical circuit elements that connect it to the write capacitor 4). For this, the capacitance C can for example be chosen to be greater than or equal to the capacitance $C_{o,2}$ defined by the following formula F2:

$$E_{SET} = \frac{1}{2}\left(\left[\frac{C_{o,2}}{C_{o,2}+C_{par}}V_{init}\right]^2 - V_{stop}^2\right)\cdot(C_{o,2}+C_{par}) \tag{F2}$$

The minimum value to be employed for the capacitance C can be determined even more precisely, by taking account of losses caused by stray or leakage resistances of the memory 1. When these additional losses are taken into account, a detailed calculation shows that the minimum capacitance $C_{o,3}$, which makes it possible to communicate to the memory element an energy equal to $E_{SET}$, is given by the following formula F3:

$$E_{SET} = \frac{1}{2}\left(\left[\frac{C_{o,3}}{C_{o,3}+C_{par}}V_{init}\right]^2 - V_{stop}^2\right)\cdot(C_{o,3}+C_{par})\cdot\alpha \tag{F3}$$

with $\alpha =$ $$\frac{R_{RESET}}{R_{RESET}+R_{sel}} \cdot \frac{R_{leak}}{R_{leak}+R_{RESET}+R_{sel}} \cdot \left(1 - \frac{R_{par}}{R_{par}+(R_{RESET}+R_{sel})//R_{leak}}\right)$$

where:
 $R_{par}$ is the series stray resistance (line resistance) mentioned above; it is the stray electrical resistance exhibited by the memory 1, between the write capacitor 4 and the memory cell object of the write operation,
 $R_{leak}$ is a leakage resistance of the array (related especially to the leakage currents of the other, non-selected cells of the array),
 and where $(R_{RESET}+R_{sel})/R_{leak}$ is a resistance that is equal to the resistance $R_{leak}$ connected in parallel with the resistance $R_{RESET}+R_{sel}$, and is therefore equal to $1/[1/(R_{leak})+1/(R_{RESET}+R_{sel})]$.

The stray resistance $R_{par}$ can take account of:
 the electrical resistance of the portions of row track 23 and column track 24 between which the cell 20S to be written is connected,
 the electrical resistance of the electrical tracks that connect the array 2 to the write capacitor 4,
 and, above all, the on state resistance (i.e. in the closed state) of the controllable connection component(s) (including the second switching element 33) which connect the write capacitor 4 to the selected cell 20S, when writing the latter; in general, this stray resistance is greater than the two preceding ones.

The stray resistance $R_{par}$ is for example equal to the sum of these three contributions.

The leakage resistance $R_{leak}$ is for example equal to the individual leakage resistance of a memory cell 20 having its selector off, divided by m+n−2 (because m+n−2 such individual leakage resistances are connected in parallel to each other). But it may be different, depending on the bias configuration employed to bias the array 2 when writing the memory cell 20S considered (i.e. whether it is the "V/2" bias configuration, or another bias configuration).

The stray capacitance $C_{par}$ can take account of:
 an effective electric capacitance $C_{par,mat}$ of the part of the array 2 formed by the row and the column at the intersection of which the memory cell 20S to be programmed is located; and
 a stray capacitance corresponding to the electrical circuit elements (tracks, controllable connection components, etc.) which connect the array 2 to the write capacitor 4.

It is for example equal to the sum of these two contributions.

The effective capacitance $C_{par,mat}$ of the array portion in question takes account of both the stray capacitances of the row electrical track 23 and the column electrical track 24 considered, and the electric capacitances of the stacks of non-selected memory cells of this row and column. It can therefore be expressed as m+n−1 times the individual stray capacitance of a "non-selected" memory cell, in the "V/2" bias configuration (it can, however, have a different value, for other bias configurations of the array). The individual stray capacitance of a "non-selected" memory cell comprises both the capacitance of the stack formed by the selector and the memory element (MIM stack), and the capacitance of the small portions of tracks associated with that memory cell (located in the immediate vicinity of that cell; these portions being the track elements repeated m×n times to form the whole row and column electrical tracks). This individual stray capacitance is therefore the total capacitance of a "bitcell" in the array.

In practice, the three estimates $C_{o,1}$, $C_{o,2}$, $C_{o,3}$ of the minimum value to be given to the capacitance C, are ordered as follows: $C_{o,1} < C_{o,2} < C_{o,3}$, and it is the $C_{o,3}$ estimate that is the most accurate. In practice, for small arrays (for example in the order of 100×100 cells or less), the values of $C_{o,2}$ and $C_{o,3}$ may be close to each other.

The capacitance C of the write capacitor 4 may for example be between one time $C_{o,2}$, and two times $C_{o,2}$ (or alternatively between one time $C_{o,2}$, and three times $C_{o,2}$). The fact that it is higher than $C_{o,2}$ allows sufficient energy to be transmitted to the memory cell 20s to write the SET state, with a high probability of success. And the fact that it is lower than two, or three times $C_{o,2}$ allows the electric energy consumed during this operation to be limited, remaining close to the energy $E_{SET}$ just necessary to carry out this write (it also makes it possible to limit the dimensions of the write capacitor to what is necessary for this write operation).

Alternatively, the capacitance C of the write capacitor 4 could be between one time $C_{o,3}$ and two times $C_{o,3}$, or between one time $C_{o,3}$ and three times $C_{o,3}$.

As for the initial write voltage $V_{init}$, it is for example chosen so that the above-mentioned voltage $V_{eq} = C/(C+C_{par})$. $V_{init}$ is greater than or equal to the high voltage threshold $V_{th}^{RESET}$ of the entire memory cell 20S. This makes it possible to obtain a sufficient voltage, across the memory cell, to perform the write operation, although the electrical charge initially contained in the write capacitor 4 is distributed between this capacitor and the stray capacitance $C_{par}$ when this capacitor is connected to the array 2 for the write operation.

As regards the initial write voltage $V_{init}$, it may be interesting to choose it relatively high (while remaining compatible with the type of memory cell and integration technology employed), because this makes it possible to reach the energy $E_{SET}$ necessary for writing even with a write capacitor of limited capacity (in other words, the minimum capacity $C_{o,1}$, $C_{o,2}$ or $C_{o,3}$ is all the smaller the higher $V_{init}$ is). In addition, a high write voltage can lead to a higher success rate and write speed.

A numerical example of sizing is set forth below.

In this example, the array 2 is a square array of 128×128 memory cells 20. Each memory cell 22 comprises a 5 nm thick hafnium oxide HfO2 active layer and a 5 nm thick titanium Ti active electrode. Each selector 21, of the OTS type, comprises a layer of so-called "GSSN" (Ge—Se—Sb—N) material with a thickness of between 10 and 15 nm. Each memory cell 20 has lateral dimensions in the order of 300 nm. The values of various electrical characteristics of this memory example are given below:

$R_{SET}$=5 kilohms;
$R_{RESET}$=194 kilohms;
$E_{SET}$=10 pJ;
$R_{sel}$=1 kilohm;
$V_{th}$=3 volts;
$I_h$=0.1 mink;
$R_{par}$=5 kilohms;
$C_{par}$=250 pF;
$R_{leak}$=approximately $0.4 \cdot 10^6$ Ohms.

The initial write voltage $V_{init}$ is chosen to be equal to 4.6 Volts, in this example. The end-of-write voltage $V_{stop}$ is approximately 1 Volt.

For these parameters, the capacitance C of the write capacitor 4 can for example be chosen equal to 2 pF (indeed, for these parameters, $C_{o,3}$ is about 2 pF).

For this example, digital simulations of the electrical response show that the total energy cost of the write operation of this SET state is 15 pJ, and that the duration of phase 3 described above is about 25 ns.

By way of comparison, for a write performed with a write pulse having a step shape (rectangular pulse), with, typically, an amplitude of 3V and a programming current (once the selector is on) limited to 200 microamperes, the energy consumption E of the write operation (expressed in pJ) is $0.6 \times t_{AS}$ (ns), where $t_{AS}$ is the duration during which the write pulse continues to be applied, after the selector has switched to the on state. In practice, the dispersion of the response times of the selectors (i.e. time after which the selector switches to the on state, when a sufficient voltage is applied to it), results in employing write pulses whose duration is such that $t_{AS}$ is typically about 100 ns, that is, an energy consumption of about 60 pJ, much higher than that obtained with the write device set forth above.

Moreover, as illustrated by this example, the values of capacitance C adapted for the write capacitor are typically between 1 and 10 pF, or possibly between 1 and 100 pF (depending on the type of memory cells used, and on the dimensions of the array). Given these values, the write capacitor can be conveniently integrated into the memory, occupying an area in the order of 0.1×0.1 mm² or less. For example, for the 2 pF capacitance mentioned above, integration over an area of about 20 μm×25 μm is possible with currently available capacitor integration technologies. In practice, the area required to make the write capacitor is comparable to, or even smaller than, the area occupied by the array 2, so that the write capacitor can for example be made on or under the array, vertically aligned with it.

The operation of the memory 1 has been set forth in detail above in the case of writing a SET state (low resistive). However, this memory, and its write device, can also be employed to write a highly resistive state (RESET), that is, to make a memory element 22 transition from its low resistive state to its highly resistive state. In this respect, it should be noted by the way that the problem of overconsumption of electricity, mentioned in the introduction with regard to writing a SET state, arises in a comparable manner when writing a RESET state. Indeed, once the selector has switched to the on state, and even though the memory element has switched to its highly resistive state, a non-negligible electrical current flows through the memory cell during the remaining duration of the write pulse. This current is lower than when writing a SET state (since the memory element is in its highly resistive state), but on the other hand, the write pulse employed for a RESET is usually much longer (sometimes 10 times longer) than for a SET. The electric energy consumed unnecessarily, when employing a write pulse of fixed duration, can therefore be as high for a RESET as for a SET. The particular write device set forth above therefore applies also usefully in the case of a RESET.

FIG. 6 schematically represents a first alternative 3b of the write device 3a of FIG. 1.

In this alternative, the charging device 30b comprises several voltage sources $31_1$, $31_2$, ... $31_n$. These different voltage sources deliver different voltages Vc1, Vc2, ..., Vcn. The charging device 30b also comprises a multiplexer 34 having:

different inputs $in_1$, $in_2$, ... $in_n$ connected respectively to these different voltage sources $31_1$, $31_2$, ... $31_n$, and an output connected to the write capacitor 4, This selector also comprises a not connected input $in_o$. It makes it possible to selectively (alternatively) connect either of said sources to the write capacitor 4, or to disconnect the capacitor 4 from these sources (by connecting it to the not connected input $in_o$). This arrangement thus makes it possible to adjust on command the voltage at which the capacitor 4 is charged, and thus the initial write voltage $V_{init}$.

In this write device 3b, the second switching element, which connects the write capacitor to the write cell 20S, is made as a multiplexer 35 with two inputs ($in_o$ and $in_1$).

FIG. 7 schematically represents a second alternative 3c of the write device 3a of FIG. 1.

In this alternative, the write device 3c comprises:

an electric source, here a voltage source 31, the write capacitor 4, and additional write capacitors $4_2$, ..., $4_n$, a charge multiplexer 36 having an input electrically connected to the source 31, and several outputs $out_1$, $out_2$, ..., $out_n$, connected respectively to the write capacitors 4 and to the various additional write capacitors $4_2$, ..., $4_n$, to selectively connect the electric source to either of the write capacitors 4, $4_2$, ..., $4_n$, or possibly to several of these write capacitors then connected in parallel, and a write multiplexer 37 having several inputs $in_1$, $in_2$, ..., $in_n$, connected respectively to the write capacitor 4 and to the different additional write capacitors $4_2$, ..., $4_n$, and an output electrically connected to the memory cell 20S to be programmed, to selectively connect this cell to either of the write capacitors 4, $4_2$, ..., $4_n$, or possibly to several of these write capacitors then connected in parallel.

FIG. 7 also shows, in the form of inserts:

the output voltages of the charge multiplexer 36, over time t (graph out(t), in the insert), and the input voltages of the write multiplexer 37, over time t (graph in(t), in the insert).

The control module of the write device 3c (not represented), which produces the control signals $S^i_0:S^i_n$ and $S^o_0:S^o_n$ of the multiplexers 36 and 37, can be configured to drive these multiplexers according to two successive phases ø1 and ø2 repeated several times successively (see FIG. 7).

In a first example of alternative 3c, during the first phase ø1, the capacitors 4, $4_2$, ..., $4_n$ are all disconnected from the memory cell 20S. And one or more of these capacitors are connected to the source 31, to charge this or these capacitors. Then, during the second phase ø2, the capacitor(s) charged during the previous phase ø1 are disconnected from the source 31, and connected to the cell 20S to write this cell.

As can be seen, this write device 3c thus makes it possible to modify on command the value of the electric capacitance employed during the writing operation, either by selecting either of the capacitors 4, $4_2$, ..., $4_n$ (which may have different electric capacities, or by connecting, in parallel, a greater or lesser number of these write capacitors.

Being able to modify the value of the electric capacitance on command is interesting because it makes it possible, for example, to write several memory cells simultaneously (as in the example of FIGS. 9 and 10), by adapting the value of the capacitance to the number of memory cells to be written.

Moreover, having several write capacitors available thus makes it possible, if necessary, to gradually increase the energy discharged in the cell to be written.

In a second example of alternative 3c, the control module is configured to control the multiplexers 36 and 37 so as to:
- discharge one of the write capacitors (for example capacitor 4) in the memory cell 20S, while another of the capacitors (for example capacitor $4_2$) is charged by the source 31, and then
- discharge this other capacitor ($4_2$) into the memory cell, while yet another capacitor (for example $4_n$, or, again, 4) is charged by the source 31, and so on.

This arrangement makes it possible to have an equivalent capacitor with a large capacity, without being limited by a long (pre)charge time, by means of the rotation set up between these different capacitors 4, $4_2$, ..., $4_n$.

Within the context of this second example, the write device could very well comprise only two write capacitors, for example capacitors 4 and $4_2$. The control module would then be configured to control the multiplexers 36 and 37 in the following sequence:
- during a first, prior execution of the phase ø2, the capacitor 4 is charged by source 31, and then,
- in the next phase ø1, the write capacitor 4 is disconnected from the source 31 and connected to the output of the write multiplexer 37 (to write the memory cell), while the additional write capacitor $4_2$ is connected to the source 31 (to be charged) and disconnected from the output of the write multiplexer 37, then
- in phase ø2: the additional write capacitor 4ø2 is disconnected from the source 31 and connected to the output of the write multiplexer 37, while the write capacitor 4 is disconnected from the output of the write multiplexer 37, and connected to the source 31 (to be charged again),
- the whole comprising the phase ø1, then the phase ø2 being then repeated, possibly several times.

This arrangement makes it possible to limit the idle times related to charging of the write capacitor(s).

FIG. 8 schematically represents a third alternative, 3d, of the memory write device.

This write device 3d is similar to the device 3a of FIG. 1, but its control module is configured in a particular way, and it further comprises a write detection and termination circuit 9.

The write detection and termination circuit 9 is configured to detect a transition of the memory element 22 of the selected cell 20S from its highly resistive state to its lowly resistive state, or vice versa. When this transition is detected, the write detection and termination circuit 9 outputs a write detection signal to the control module (not represented).

As for the control module, it is configured to control the multiplexers 32' and 33' so as to execute steps a) and b) several times successively (in other words, so as to repeat the phases ø1, then ø2 several times successively) so as to apply to the memory cell 20S a sequence of several successive write pulses (multi-pulse write technique). Moreover, it is configured here to control a termination of this sequence of write pulses (by connecting the output of the multiplexer 33' to its not connected input, for example), upon receipt of the write detection signal.

As mentioned above, several memory cells $20_1$, $20_2$, ..., $20_n$ of the array 2 can be written simultaneously with the write device set forth above (be it the alternative 3a, 3b or 3c of this device).

For this purpose, the connection device 5 of the memory can be configured to, in step b), connect the write capacitor 4 (or write capacitors, if several capacitors are used, in parallel, or alternately) with several memory cells $20_1$, $20_2$, ..., $20_n$ of the array, electrically connected in parallel with each other, as represented in FIG. 9. This writing configuration is adapted to write a highly resistive state (RESET) in each of these cells. Indeed, in this arrangement, when the selector of one of these cells switches to the on state, its memory element is written, in a highly resistive state, so that it avoids a collapse of the common voltage applied to all the selected cells $20_1$, $20_2$, ..., $20_n$, and allows the writing operation for the other cells, not yet written, to be continued.

In FIG. 9, the cells $20_1$, $20_2$, ..., $20_n$ are represented as being directly connected in parallel to each other. However, this is a schematic representation, and in practice, controllable switching elements of the connection device 5 may be present between these different cells.

The connection device 5 of the memory may also be configured to, in step b), connect the write capacitor 4 (or write capacitors, if several capacitors are used, in parallel, or alternately) with several memory cells $20_1$, $20_2$, ..., $20_n$ of the array, electrically connected in series with each other (or, possibly, to electrically connect the write capacitor 4 to a memory cell of the array 2, as well as to a memory cell of another array, these two memory cells being electrically connected in series one after the other). Unlike the configuration of FIG. 9, this writing configuration is adapted to write a lowly resistive state (SET) in each of these cells.

The invention claimed is:

1. A memory comprising an array of resistive memory cells of a same type including at least one memory cell to be programmed, a write device to program the at least one memory cell to be programmed and a connection device configured to selectively connect the at least one memory cell to be programmed to the write device, or to connect a given group of memory cells of the array to the write device, the array comprising row electrical tracks and column electrical tracks, each memory cell being connected between one of the row electrical tracks and one of the column electrical tracks, the memory cell comprising:
a memory element having at least a highly resistive state and a lowly resistive state, and a selector arranged in series with the memory element, the selector being electrically conductive when a voltage greater than a given threshold voltage is applied to the selector, and provided that a current flowing through the selector is greater than a given holding current, the write device comprising at least one write capacitor and one charging device, and being configured to:
  a) charge the write capacitor with the charging device to a given initial write voltage, and then
  b) connect the write capacitor thus charged, to the at least one memory cell to be programmed by the connection device, to program said cell,
wherein the charging device comprises:
  different voltage sources, and
  a multiplexer having: different inputs connected respectively to said different voltage sources, and an output connected to the write capacitor, to selectively connect either of said sources to the write capacitor.

2. The memory according to claim 1, wherein the write capacitor has an electric capacitance greater than or equal to an electric capacitance $C_{o,1}$ defined by the following formula:

$$E_{SET} = \tfrac{1}{2}(V_{init}^2 - V_{stop}^2)C_{o,1} \qquad \text{(F1)}$$

where:
  $V_{init}$ is the initial write voltage,
  $V_{stop}$ is an end-of-write voltage, equal to, or greater than a voltage for holding the memory cell in the on state, and where
  $E_{SET}$ is an electric energy to be supplied to the memory element to make it transition from its highly resistive state to its lowly resistive state.

3. The memory according to claim 2, wherein the electric capacitance of the write capacitor is, furthermore, greater than or equal to an electric capacitance $C_{o,2}$ defined by the following formula, where $C_{par}$ is a stray electric capacitance, exhibited by the memory between the write capacitor and the cell programmed in step b):

$$E_{SET} = \frac{1}{2}\left(\left[\frac{C_{o,2}}{C_{o,2}+C_{par}}V_{init}\right]^2 - V_{stop}^2\right)\cdot(C_{o,2}+C_{par}). \qquad \text{(F2)}$$

4. The memory according to claim 3, wherein the capacitance of the write capacitor is between one and three times $C_{o,2}$.

5. The memory according to claim 3, wherein the electric capacitance of the write capacitor is, furthermore, greater than or equal to an electric capacitance $C_{o,3}$ defined by the following formula:

$$E_{SET} = \frac{1}{2}\left(\left[\frac{C_{0,3}}{C_{0,3}+C_{par}}V_{init}\right]^2 - V_{stop}^2\right)\cdot(C_{o,3}+C_{par})\cdot\alpha$$

$$\text{with } \alpha = \frac{R_{RESET}}{R_{RESET}+R_{sel}}\cdot\frac{R_{leak}}{R_{leak}+R_{RESET}+R_{sel}}\cdot\left(1 - \frac{R_{par}}{R_{par}+//R_{leak}}\right)$$

where:
  $R_{par}$ is a series stray resistance, exhibited by the memory between the write capacitor and the cell programmed in step b),
  $R_{RESET}$ is an electrical resistance of the memory element in its highly resistive state,
  $R_{leak}$ is a leakage resistance of the array,
  $R_{sel}$ is an electrical resistance of the selector in the on-state, and where
  $(R_{RESET}+R_{sel})/R_{leak}$ is the resistance equal to: the resistance $R_{leak}$ connected in parallel to the resistance $R_{RESET}+R_{sel}$.

6. The memory according to claim 1, wherein the connection device is configured to, in step b), connect the write capacitor to several memory cells of the array, electrically connected in parallel with each other.

7. The memory according to claim 1, wherein the connection device is configured to, in step b), connect the write capacitor to several memory cells of the array electrically connected in series with each other, or to electrically connect the write capacitor to said memory cell, as well as to a memory cell of another array of memory cells, said two memory cells being electrically connected in series one after the other.

8. A memory comprising an array of resistive memory cells of a same type including at least one memory cell to be programmed, a write device to program the at least one memory cell to be programmed and a connection device configured to selectively connect the at least one memory cell to be programmed to the write device, or to connect a given group of memory cells of the array to the write device,
the array comprising row electrical tracks and column electrical tracks, each memory cell being connected between one of the row electrical tracks and one of the column electrical tracks, the memory cell comprising:
  a memory element having at least a highly resistive state and a lowly resistive state, and
  a selector arranged in series with the memory element, the selector being electrically conductive when a voltage greater than a given threshold voltage is applied to the selector, and provided that a current flowing through the selector is greater than a given holding current,
the write device comprising at least one write capacitor and one charging device, and being configured to:
  a) charge the write capacitor with the charging device to a given initial write voltage, and then
  b) connect the write capacitor thus charged, to the at least one memory cell to be programmed by the connection device, to program said cell,
wherein the write device comprises:
  an electric source,
  at least one additional write capacitor,
  a charge multiplexer having: an input electrically connected to the electric source, and at least two outputs, respectively connected to the write capacitor and to the additional write capacitor, to selectively connect the electric source to either of said write capacitors,
  a write multiplexer having: at least two inputs, connected respectively to the write capacitor and to the additional write capacitor, and an output electrically connected to the memory cell, to selectively connect the memory cell to be programmed to either of the write capacitors.

9. The memory according to claim 8, wherein the write device comprises a control module configured to drive the charge multiplexer and the write multiplexer so that:
  during a first phase: the write capacitor is disconnected from the source and connected to the output of the write multiplexer, while the additional write capacitor is connected to the source and disconnected from the output of the write multiplexer, and so that
  during a second, subsequent, phase: the additional write capacitor is disconnected from the source and connected to the output of the write multiplexer, while the write capacitor is disconnected from the output of the write multiplexer.

10. A memory comprising an array of resistive memory cells of a same type including at least one memory cell to be programmed, a write device to program the at least one memory cell to be programmed and a connection device configured to selectively connect the at least one memory cell to be programmed to the write device, or to connect a given group of memory cells of the array to the write device, the array comprising row electrical tracks and column electrical tracks, each memory cell being connected between one of the row electrical tracks and one of the column electrical tracks, the memory cell comprising:
   a memory element having at least a highly resistive state and a lowly resistive state, and
   a selector arranged in series with the memory element, the selector being electrically conductive when a voltage greater than a given threshold voltage is applied to the selector, and provided that a current flowing through the selector is greater than a given holding current, the write device comprising at least one write capacitor and one charging device, and being configured to:
   a) charge the write capacitor with the charging device to a given initial write voltage, and then
   b) connect the write capacitor thus charged, to the at least one memory cell to be programmed by the connection device, to program said cell,
wherein:
   the write device is configured to perform steps a) and b) several times successively so as to apply to said memory cell a sequence of several successive write pulses, and wherein
   the write device comprises a write detection and termination circuit, configured to:

detect a transition of the memory element from its highly resistive state to its lowly resistive state, or vice versa, and then to
control a termination of said sequence of write pulses as soon as the transition of the memory element from its highly resistive state to its lowly resistive state, or vice versa, has been detected.

11. A method for writing a resistive memory cell, by a write device comprising at least one write capacitor and one charging device, the memory cell comprising:
   a memory element having at least a highly resistive state and a lowly resistive state, and
   a selector arranged in series with the memory element, the selector being electrically conductive when a voltage greater than a given threshold voltage is applied to the selector and provided that a current flowing through the selector is greater than a given holding current,
the method comprising:
   a) charging the write capacitor with the charging device to a given initial write voltage, the write capacitor being disconnected from said memory cell during charging of the capacitor, and then
   b) connecting the write capacitor thus charged, to the memory cell, to program said cell, wherein the write capacitor employed in steps a) and b) has an electric capacitance greater than or equal to an electric capacitance $C_{o,1}$ defined by the following formula $$E_{SET} = (V_{init}^2 - V_{stop}^2) C_{o,1} \tag{F1}$$

where:
   $V_{init}$ is the initial write voltage,
   $V_{stop}$ is an end-of-write voltage, equal to or greater than a voltage for holding the memory cell in the on state, and where
   $E_{SET}$ is an electric energy to be supplied to the memory cell to make it transition from its highly resistive state to its lowly resistive state.

* * * * *